(12) United States Patent
Maejima

(10) Patent No.: US 7,978,497 B2
(45) Date of Patent: Jul. 12, 2011

(54) NONVOLATILE SEMICONDUCTOR MEMORY DEVICE

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 12/401,200

(22) Filed: Mar. 10, 2009

(65) Prior Publication Data

US 2009/0244953 A1   Oct. 1, 2009

(30) Foreign Application Priority Data

Mar. 11, 2008   (JP) .................................. 2008-061753

(51) Int. Cl.
*G11C 7/00*   (2006.01)

(52) U.S. Cl. ........................................ 365/148; 365/158

(58) Field of Classification Search .................. 365/148, 365/158

See application file for complete search history.

(56) References Cited

U.S. PATENT DOCUMENTS

| 5,684,732 | A | 11/1997 | Sako |
| 6,141,241 | A | 10/2000 | Ovshinsky et al. |
| 7,307,268 | B2 | 12/2007 | Scheuerlein |
| 2003/0002331 | A1 | 1/2003 | Park et al. |
| 2006/0062043 | A1 | 3/2006 | Roehr et al. |
| 2007/0165442 | A1* | 7/2007 | Hosoi et al. .................... 365/100 |
| 2008/0094906 | A1* | 4/2008 | Cascone et al. .......... 365/185.18 |

FOREIGN PATENT DOCUMENTS

| JP | 2005-196954 | 7/2005 |
| JP | 2006-99882 | 4/2006 |
| WO | WO 2007/074504 A1 | 7/2007 |

OTHER PUBLICATIONS

Y. Hosoi, et al., "High Speed Unipolar Switching Resistance RAM Technology", IEDM, 2006, 4 Pages.
U.S. Appl. No. 12/720,121, filed Mar. 9, 2010, Maejima.
U.S. Appl. No. 12/720,105, filed Mar. 9, 2010, Maejima, et al.
U.S. Appl. No. 12/721,092, filed Mar. 10, 2010, Maejima et al.
Office Action issued Nov. 2, 2010 in JP Application No. 2008-061753 (With English Translation).
U.S. Appl. No. 12/885,896, filed Sep. 20, 2010, Maejima.

* cited by examiner

*Primary Examiner* — Michael T Tran
(74) *Attorney, Agent, or Firm* — Oblon, Spivak, McClelland, Maier & Neustadt, L.L.P.

(57) ABSTRACT

A nonvolatile semiconductor memory device comprises a memory cell array including first and second mutually crossing lines and electrically erasable programmable memory cells arranged at intersections of the first and second lines, each memory cell containing a variable resistive element; a data write circuit operative to apply a voltage required for data write to the memory cell via the first and second lines; and a current limit circuit operative to limit the value of current flowing in the memory cell on the data write at a certain current limit value.

18 Claims, 13 Drawing Sheets

FIG. 6
(a) Schottky Structure
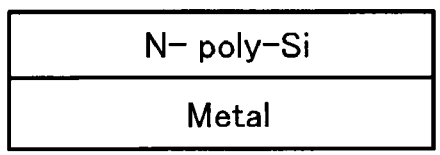
(d) MIM Structure
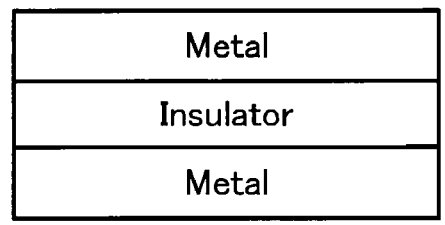
(b) PN Structure
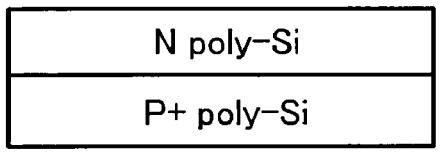
(e) SIS Structure
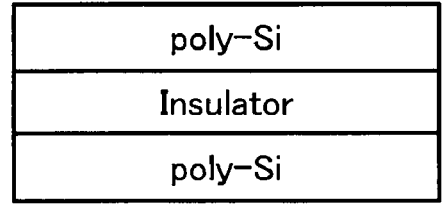
(c) PIN Structure
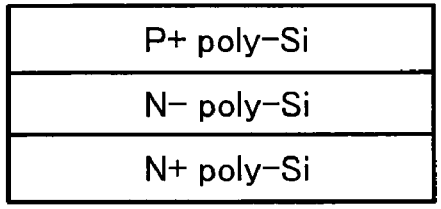

NONVOLATILE SEMICONDUCTOR MEMORY DEVICE

CROSS-REFERENCE TO RELATED APPLICATION

This application is based upon and claims the benefit of priority from the prior Japanese Patent Application No. 2008-61753, filed on Mar. 11, 2008, the entire contents of which are incorporated herein by reference.

BACKGROUND OF THE INVENTION

1. Field of the Invention

The present invention relates to a nonvolatile semiconductor memory device for nonvolatilely writing data in accordance with application of a voltage to a variable resistive element.

2. Description of the Related Art

In recent years, attention has been focused on a nonvolatile memory comprising memory cells each containing a variable resistive element, which are connected at intersections of word lines and bit lines and arranged in matrix.

Known examples of the nonvolatile memory of such the type include: a PCRAM (Phase-Change Random Access Memory) that uses a chalcogenide element as the variable resistive element; a ReRAM (Resistance Random Access Memory) that uses a transition metal oxide element; and a CBRAM that changes the resistance by precipitating metal cations to form a bridge (conducting bridge) between electrodes and ionizing the precipitated metal to destruct the bridge. These variable resistive memories are characterized in that the variation in resistance is stored as information.

The PCRAM utilizes the shape, such as the magnitude and the width, of a current/voltage pulse applied to the chalcogenide element to control the process from heating to cooling, thereby causing a phase change between the crystalline state and the amorphous state to control the resistance of the element (see Patent Document 1: JP 2002-541613T). The ReRAM includes the bipolar type and the unipolar type. In the case of the bipolar type, the direction of the current/voltage pulse applied to the transition metal oxide element is used to control the resistance of the element. On the other hand, in the case of the unipolar type, the magnitude and the width of the current/voltage pulse applied to the transition metal oxide element are used to control the resistance of the element.

In the case of the ReRAM of the unipolar type, data can be programmed in a variable resistive memory by applying a program voltage of around 6.0 V to the variable resistive element for around 10 ns, thereby changing the variable resistive element from a high-resistance state to a low-resistance state. This state change is referred to as "program" or "set". When an erase voltage of around 2.0 V is applied to the data-programmed variable resistive element and a flow of current of 1-10 µA is supplied for 200 ns to 1 µs, the variable resistive element is changed from the low-resistance state to the high-resistance state. This state change is referred to as "erase" or "reset".

In setting for changing the high-resistance memory cell to the low-resistance state, when an application of the applied pulse is excessively longer, the memory cell once changed into the low-resistance state is again reset to the high-resistance state due to production of Joule heat as a problem. In resetting for changing the low-resistance memory cell to the high-resistance state, when the memory cell changes to the high-resistance state, the voltage regulator operative to generate the voltage of the applied pulse can not follow this speed. Thus, the supply of charge becomes excessive, the voltage of the applied pulse becomes higher, the controllability becomes worse, and the memory cell is returned again to the set state in the worst case as a problem.

SUMMARY OF THE INVENTION

In an aspect the present invention provides a nonvolatile semiconductor memory device, comprising: a memory cell array including first and second mutually crossing lines and electrically erasable programmable memory cells arranged at intersections of the first and second lines, each memory cell containing a variable resistive element; a data write circuit operative to apply a voltage required for data write to the memory cell via the first and second lines; and a current limit circuit operative to limit the value of current flowing in the memory cell on the data write at a certain current limit value.

In another aspect the present invention provides a nonvolatile semiconductor memory device, comprising: a memory cell array including first and second mutually crossing lines and electrically erasable programmable memory cells arranged at intersections of the first and second lines, each memory cell containing a variable resistive element; a data write circuit operative to apply a voltage required for data write to the memory cell via the first and second lines; and a charge limit circuit operative to limit the amount of charge supplied to the memory cell on the data write at a certain charge limit value.

In yet another aspect the present invention provides a nonvolatile semiconductor memory device, comprising: a memory cell array including first and second mutually crossing lines and electrically erasable programmable memory cells arranged at intersections of the first and second lines, each memory cell containing a variable resistive element; a data erase circuit operative to supply a current required for data erase to the memory cell via the first and second lines; and a voltage clamp circuit operative to limit the value of a voltage applied to the memory cell on the data erase at a certain voltage limit value.

BRIEF DESCRIPTION OF THE DRAWINGS

FIG. 6 is a schematic cross-sectional view showing a non-ohmic element example in the same embodiment.

DETAILED DESCRIPTION OF THE EMBODIMENTS

First Embodiment

A first embodiment of the invention will now be described with reference to the drawings.

[Entire Configuration]

Figure 1:
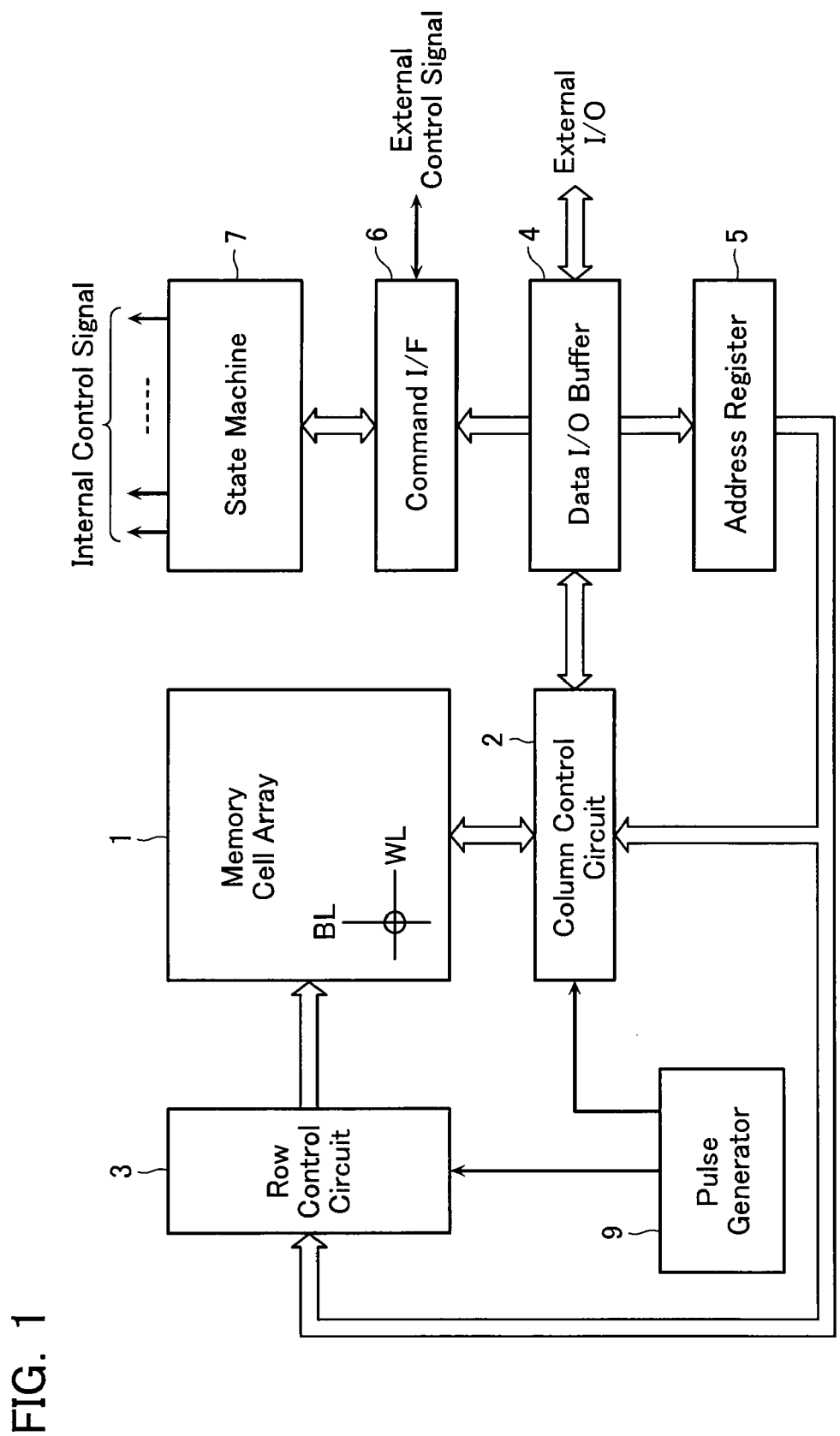
FIG. 1 is a block diagram of a nonvolatile semiconductor memory according to a first embodiment of the present invention.

FIG. 1 is a block diagram of a nonvolatile memory according to the first embodiment of the present invention.

The nonvolatile memory comprises a memory cell array 1 of memory cells arranged in matrix, each memory cell including a later-described variable resistive element, as in a PCRAM (Phase-Change RAM) and a ReRAM (Resistance RAM). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell. The column control circuit 2 and the row control circuit 3 configure a data read/write circuit for use in data read/write to the memory cell array 1.

A data I/O buffer 4 is connected to an external host device, not shown, to receive write data, receive erase instructions, provide read data, and receive address data and command data from/to the host device. The data I/O buffer 4 sends received write data to the column control circuit 2 and receives read-out data from the column control circuit 2 and provides it to external. An address fed from the external host device to the data I/O buffer 4 is sent via an address register 5 to the column control circuit 2 and the row control circuit 3. A command fed from the external host device to the data I/O buffer 4 is sent to a command interface 6. The command interface 6 receives an external control signal from external and decides whether the data fed to the data I/O buffer 4 is write data, a command or an address. If it is a command, then the command interface transfers it as a received command signal to a state machine 7. The state machine 7 manages the entire nonvolatile memory to receive commands from the external host device, read, write, erase, and execute data I/O management. The external host device can also receive status information managed by the state machine 7 and decide the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3.

Peripheral circuit elements other than the memory cell array 1 can be formed in a Si substrate immediately beneath the memory array 1 formed in a wiring layer. Thus, the chip area of the nonvolatile memory can be made almost equal to the area of the memory cell array 1.

[Memory Cell Array and Peripheral Circuits]

Figure 2:
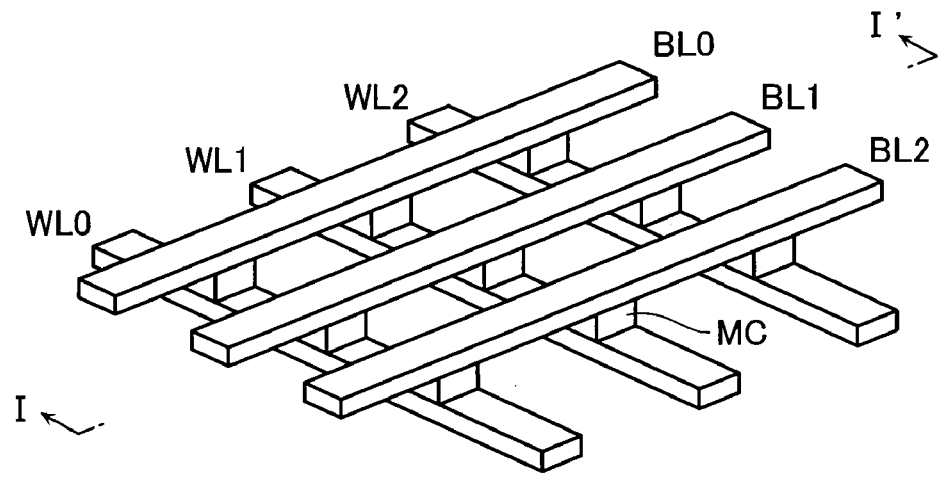
FIG. 2 is a perspective view of part of a memory cell array in the nonvolatile memory according to the same embodiment.
Figure 3:
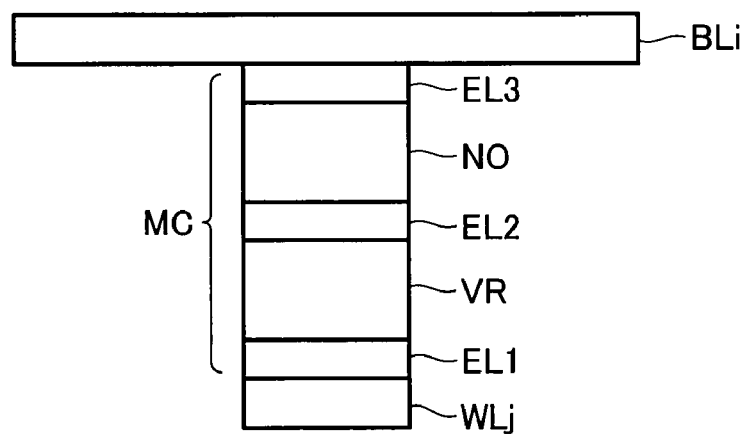
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines orbit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistive element VR and a non-ohmic element NO as shown in FIG. 3.

The variable resistive element VR can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (contacting bridge) between electrodes and ionizing the precipitated metal to destruct the bridge (CBRAM); and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

Figure 4:
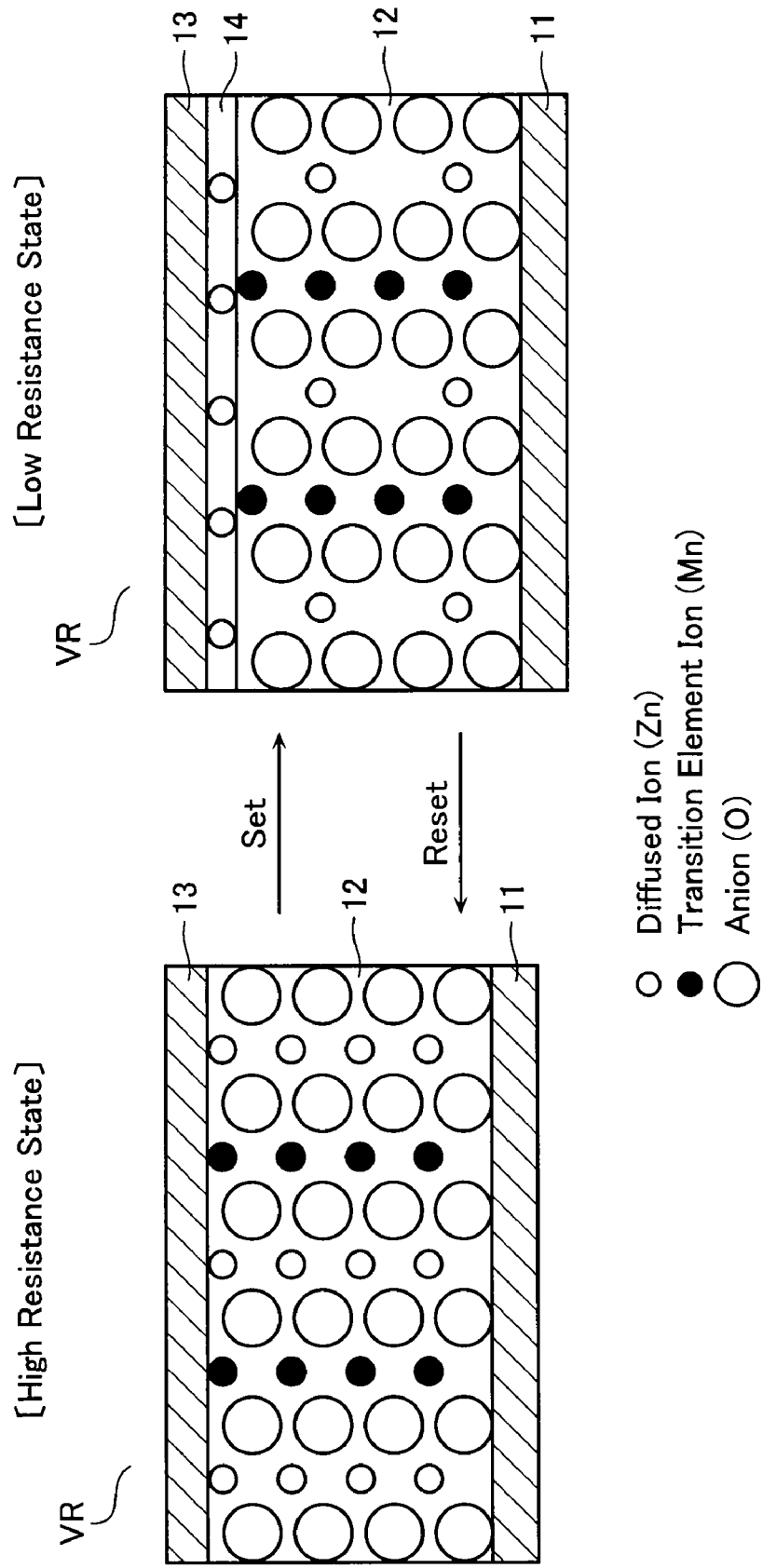
FIG. 4 is a schematic cross-sectional view showing a variable resistive element example in the same embodiment.
Figure 5:
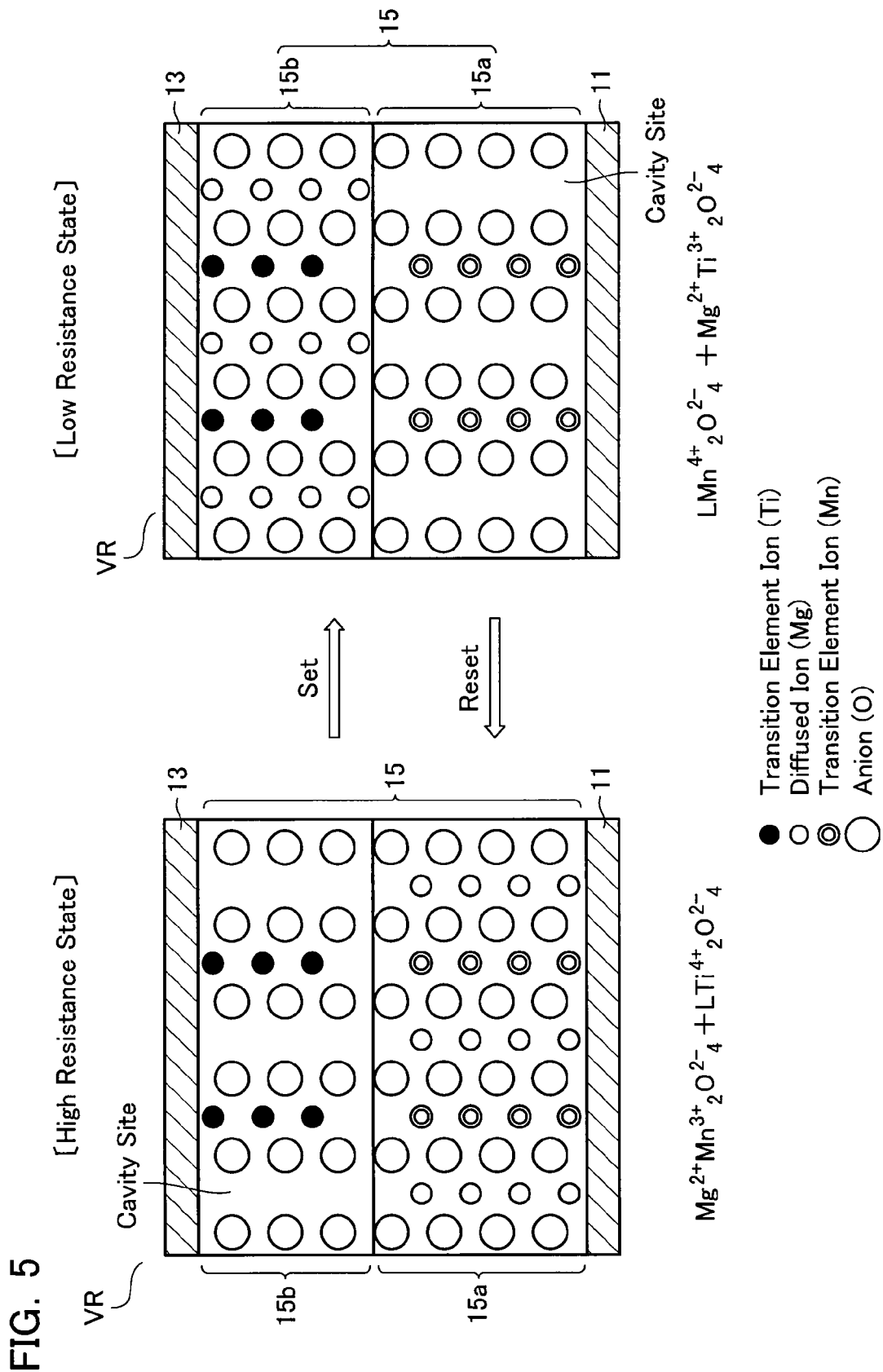
FIG. 5 is a schematic cross-sectional view showing another variable resistive element example in the same embodiment.

FIGS. 4 and 5 show examples of the ReRAM. The variable resistive element VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has cavity sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition element ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistive element VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes cavity sites capable of accommodating diffused ions. Accordingly, the diffused ions moved from the first compound layer 15a are trapped in the cavity sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for sufficient time for Joule heating to facilitate the oxidation reduction reaction in the recording layer 15, like in the preceding example. Application of an electric field in the opposite direction from that at the time of setting may also allow reset.

The non-ohmic element NO may include various diodes as shown in FIG. 6, for example, (a) a Schottky diode, (b) a PN-junction diode, (c) a PIN diode and may have (d) a MIM (Metal-Insulator-Metal) structure, and (e) a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistive element VR may be arranged in the opposite direction compared with FIG. 3 and the polarity of the non-ohmic element NO may be inverted.

Figure 7:
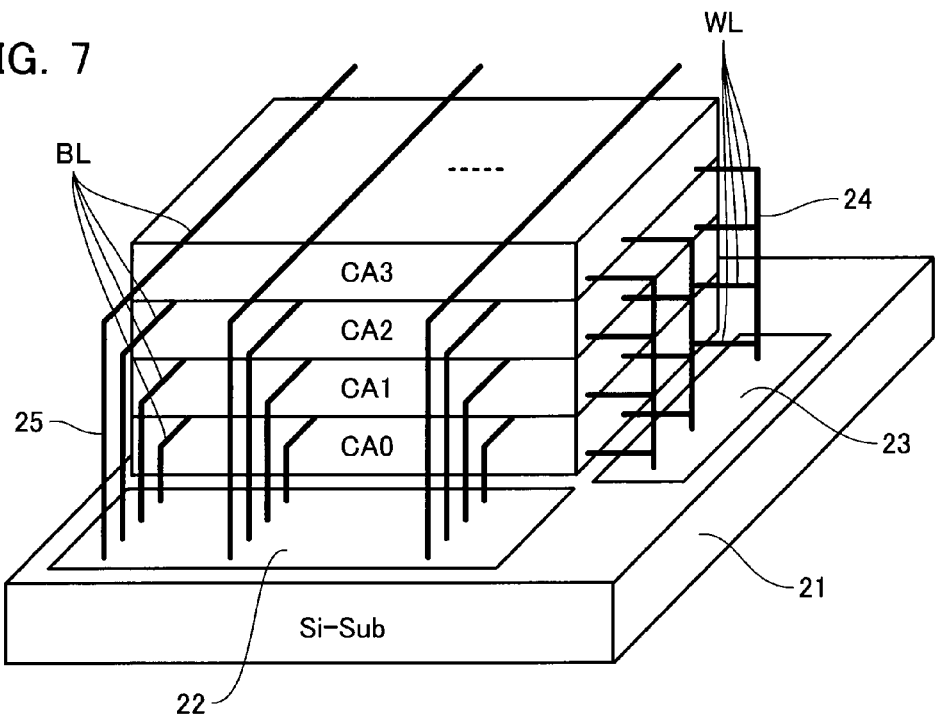
FIG. 7 is a perspective view of the memory cell array and peripheral circuits thereof according to the same embodiment.

Plural such memory structures described above may be stacked to form a three-dimensional structure as shown in FIG. 7, which shows an example of four-layered cell arrays CA0-CA3 stacked on a silicon substrate 21. Word lines WLs in the cell arrays are commonly connected through via-lines 24 and connected to a row control circuit 23 on the substrate 21. Bit lines BL0-BL3 in the cell arrays CA0-CA3 are independently connected through respective via-lines 25 to a column control circuit 22 on the substrate 21.

Figure 8:
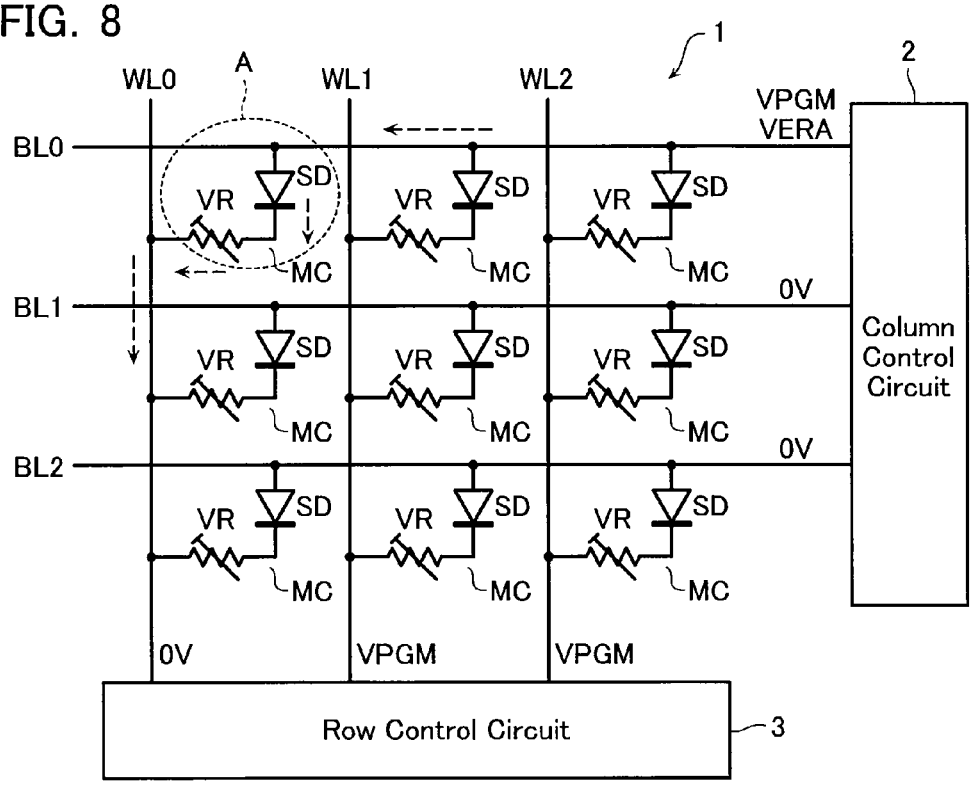
FIG. 8 is a circuit diagram of the memory cell array and peripheral circuits thereof according to the same embodiment.
Figure 9:
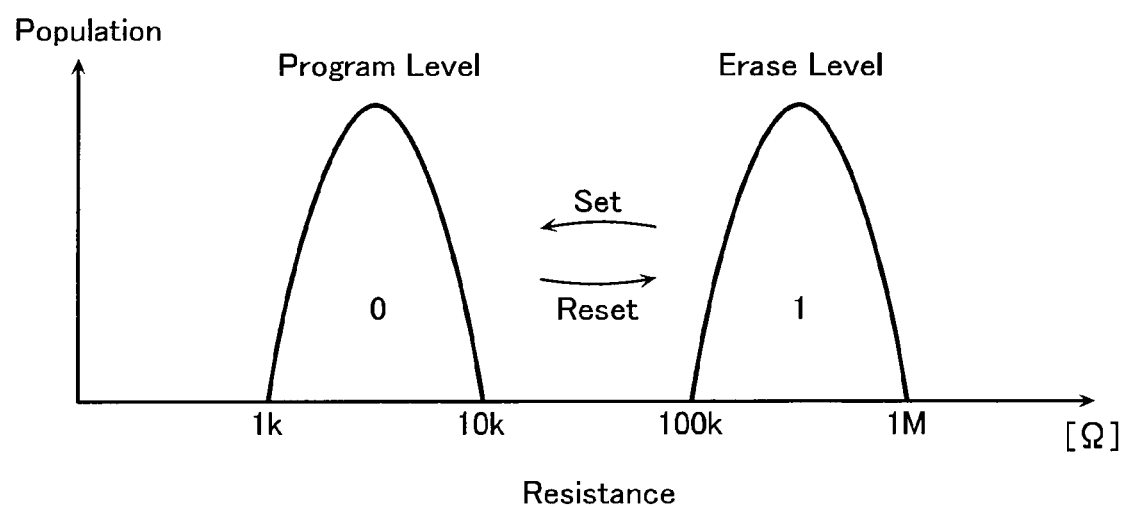
FIG. 9 is a graph showing a relation between resistance distributions and data among memory cells in the case of binary data.

FIG. 8 is an equivalent circuit diagram showing details of the memory cell array 1 of FIG. 1. A diode SD is herein used as the non-ohmic element NO and, for simplicity of description, it is assumed to have a single-layered structure to advance the description.

In FIG. 8, a memory cell MC in the memory cell array MA includes a diode SD and a variable resistive element VR connected in series. The diode SD has an anode connected to a bit line BL and a cathode connected via the variable resistive element VR to a word line WL. Each bit line BL has one end connected to the column control circuit 2. Each word line WL has one end connected to the row control circuit 3.

The memory cells MC may be selected individually. Alternatively, data in plural memory cells MC connected to the selected word line WL1 may be read out together in another mode. The memory cell array 1 may be configured such that current flows from the word line WL to the bit line BL with the inverted polarity of the diode SD compared to the circuit of FIG. 8.

[Operation of Nonvolatile Memory]

The following description is given to operation of the nonvolatile semiconductor memory thus configured.

In this example, a memory cell MC connected to a word line WL0 and a bit line BL0 is assumed as a selected cell A shown with a dotted circle in FIG. 8 and subjected to data erase and program. Data erase can be executed by resetting, that is, applying 0 V to the word line WL0 and an erase voltage VERA of, for example, around 2.0 V to the bit line BL0 to supply a current of 1-10 μA only for 200 ns to 1 μs. Data write (program) in the variable resistive element VR can be executed by such processing as applying 0 V to the word line WL0 and a program voltage VPGM of, for example, around 6.0 V (with a current value of around 10 nA) to the bit line BL0 only for 10-100 ns to shift the resistance of the variable resistive element VR into the low-resistance range. Data erase corresponds to "1"-data programming or resetting while data write corresponds to "0"-data programming or setting. The resistance of the variable resistive element VR contained in the memory cell MC distributes over a high-resistance range of 100 kΩ to 1 MΩ in the erased state and over a low-resistance range of 1-10 kΩ in the written (programmed) state.

[Operation of Read/Write Circuit in ReRAM]

The following description is given to a specific read/write circuit in the ReRAM and operation thereof.

Figure 10:
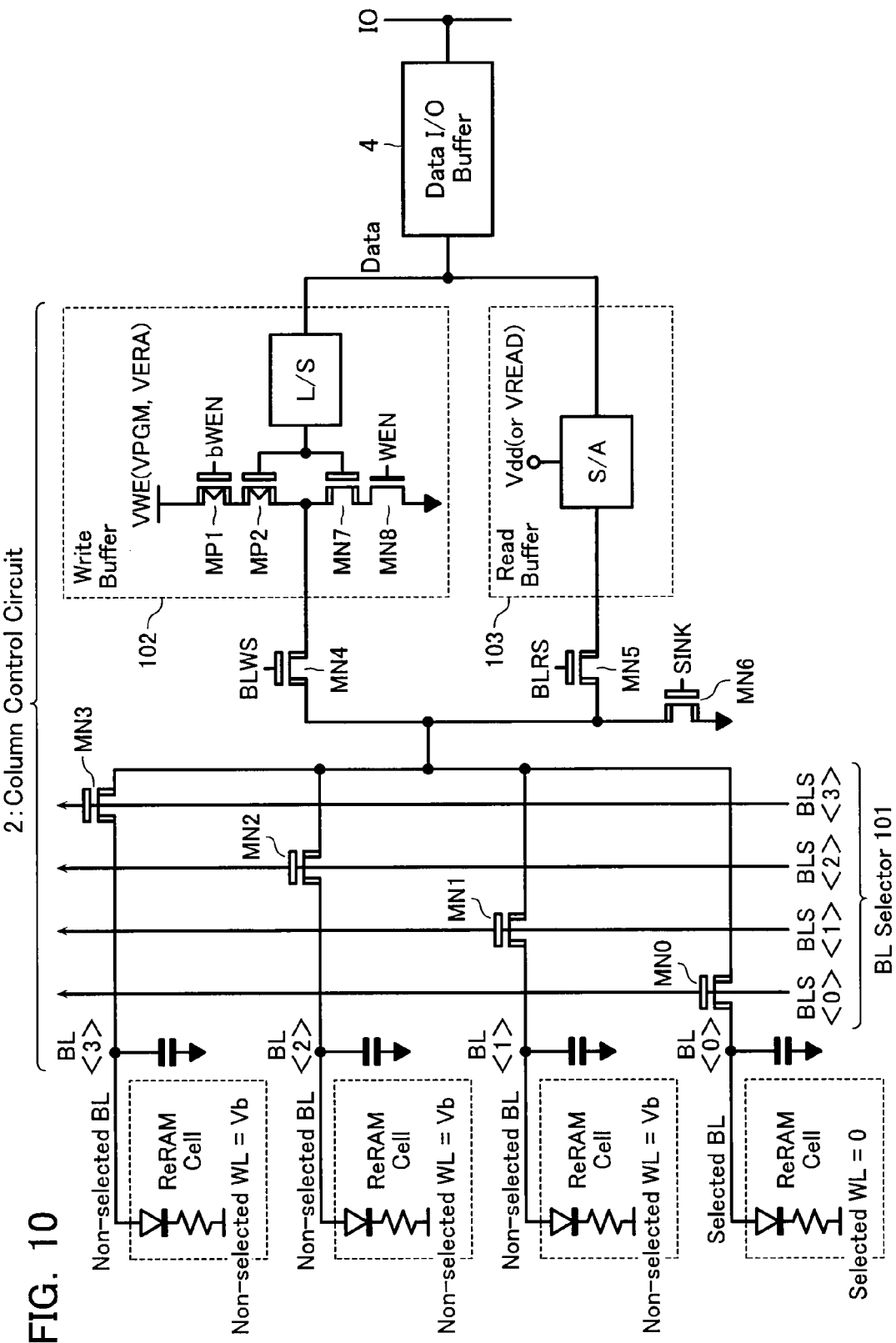
FIG. 10 is a circuit diagram showing a column control circuit and the periphery thereof according to the same embodiment.

FIG. 10 shows details of the column control circuit 2 contained in the read/write circuit. The column control circuit 2 includes a bit line selector 101, and a write buffer 102 and a read buffer 103 connected to a bit line selected by the selector. The write buffer 102 and the read buffer 103 are connected via a data I/O buffer 4 to data lines I/O.

A circuit exemplified as the bit line selector 101 herein includes four selection NMOS transistors MN0-MN3, which are driven by selection signals BLS<0>-<3> to select one of four bit lines BL<0>-<3>. The selection NMOS transistors MN0-MN3 are high-breakdown voltage transistors. When the bit line BL<0> is selected, the corresponding word line is kept at Vss (=0 V), and a blocking voltage Vb (corresponding to VPGM in FIG. 8) selected in accordance with write/read is applied to non-selected word lines.

In the case of the three-dimensional cell array described in FIG. 7, the bit line selector 101 requires cell array selection and bit line selection in the cell array and actually becomes very complicated though a configuration for simply selecting one of four bit lines is exemplified herein.

The bit line selected by the selector 101 is connected to the write buffer 102 when a switch NMOS transistor MN4 is turned on with a write selection signal BLWS, and to the read buffer 103 when a switch NMOS transistor MN5 is turned on with a read selection signal BLRS. These NMOS transistors MN4, MN5 are also high-breakdown voltage transistors.

The write buffer 102 includes a CMOS driver containing a PMOS transistor MP2 and an NMOS transistor MN7. The PMOS transistor MP2 is connected via an activation PMOS transistor MP1 to a voltage application node VWE, and the NMOS transistor MN7 is connected via an activation NMOS transistor NM8 to a ground node Vss. The CMOS driver has a common gate, which is given write data via a level shifter L/S.

On the other hand, the read buffer 103 includes a sense amplifier S/A. Available examples of the sense amplifier S/A include various types such as the single-ended type and the differential type that uses a reference cell.

Figure 11:
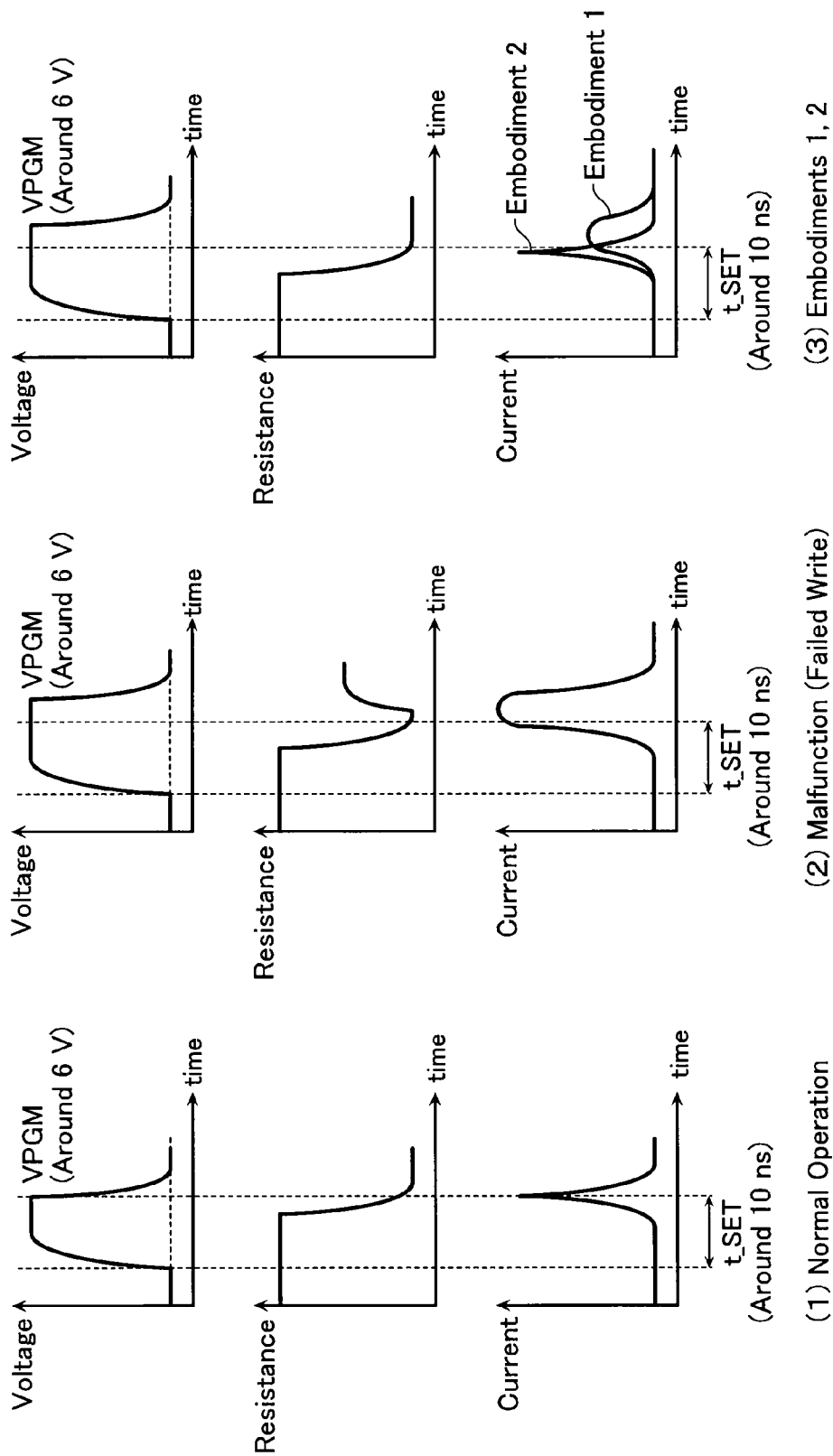
FIG. 11 provides waveform diagrams for illustrating a method of data writing in the nonvolatile semiconductor memory according to the same embodiment.

FIG. 11 provides operational waveform diagrams showing program voltages VPGM, resistance value variations in the memory cell MC, and current value variations in the memory cell MC on setting by the write buffer 102. FIG. 11(1) shows operational waveforms on normal operation. When a program voltage VPGM of around 6 V is applied to a selected cell for around 10 ns, the resistance value in the selected cell varies from the high-resistance state to the low-resistance state. At the instance of this variation, a current flows slightly. At the instance of the increase in current, however, the application of the program voltage VPGM is stopped. Accordingly, the resistance value in the selected cell is not susceptible to this current.

On the other hand, FIG. 11(2) shows a case of a malfunction occurrence. When a program voltage VPGM is applied longer than a certain time, a large current flows continuously after the resistance value in the selected cell varies to the low-resistance state. In this case, Joule heat is produced inside the cell, and the selected cell is reset again and returned to the high-resistance state.

Therefore, the first embodiment limits the current supplied to the write buffer 102 on writing as shown in FIG. 11(3) to prevent the above malfunction from occurring.

Figure 12:
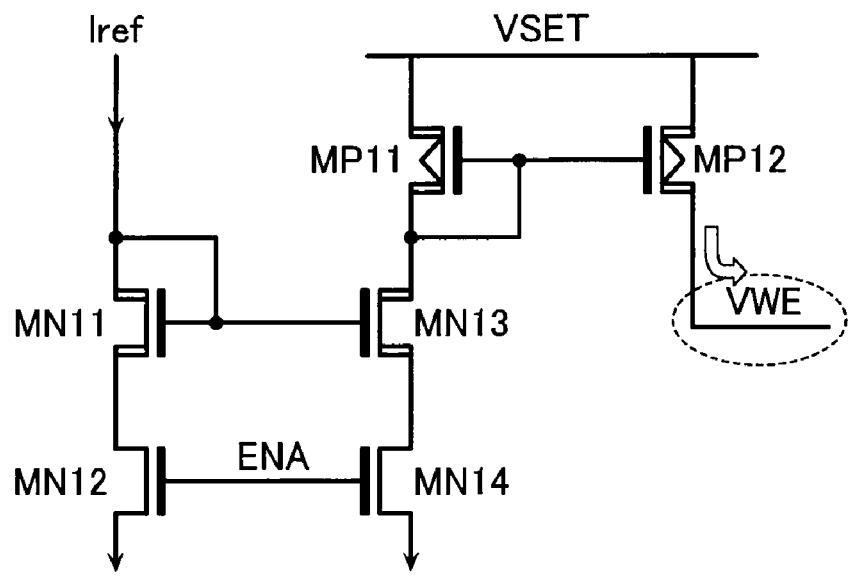
FIG. 12 is a circuit diagram of a current limit circuit for use on data writing according to the same embodiment.

FIG. 12 is a circuit diagram showing a current limit circuit available in the present embodiment. The current limit circuit is used to provide a current-limited voltage VWE to the write buffer 102, and supplies a program voltage VPGM based on a set voltage VSET as the voltage VWE on data setting and an erase voltage VERA based on a reset voltage VRESET as the voltage VWE on data resetting.

The current limit circuit includes high-breakdown voltage NMOS transistors MN11, MN13, which configure a first current mirror circuit operative to receive a flow of reference current Iref supplied from a constant current source, not shown; NMOS transistors MN12, MN14 arranged to activate the above transistors; and high-breakdown voltage PMOS transistors MP11, MP12, which configure a second current mirror circuit operative to receive the current flowing in the transistor MN13.

In this circuit, when an enable signal ENA becomes "1", the NMOS transistors MN12, MN14 turn on to allow the reference current Iref to flow through the NMOS transistors MN11, MN12 and the current determined by a mirror ratio between the NMOS transistors MN11, MN13 to flow through the PMOS transistor NP11 and the NMOS transistors MN13, MN14. The PMOS transistor MP12 at the output stage has a drain that supplies the voltage VWE based on the set voltage VSET, of which current value is though limited at the current value determined by the value of current flowing in the PMOS transistor MP11 and a mirror ratio between the PMOS transistors MP11, NP12. Thus, as shown in FIG. 11(3), even if variations arise in application time of the program voltage VPGM, the value of current flowing in the selected cell is limited. Accordingly, it is possible to prevent failed write from occurring.

Second Embodiment

Figure 13:
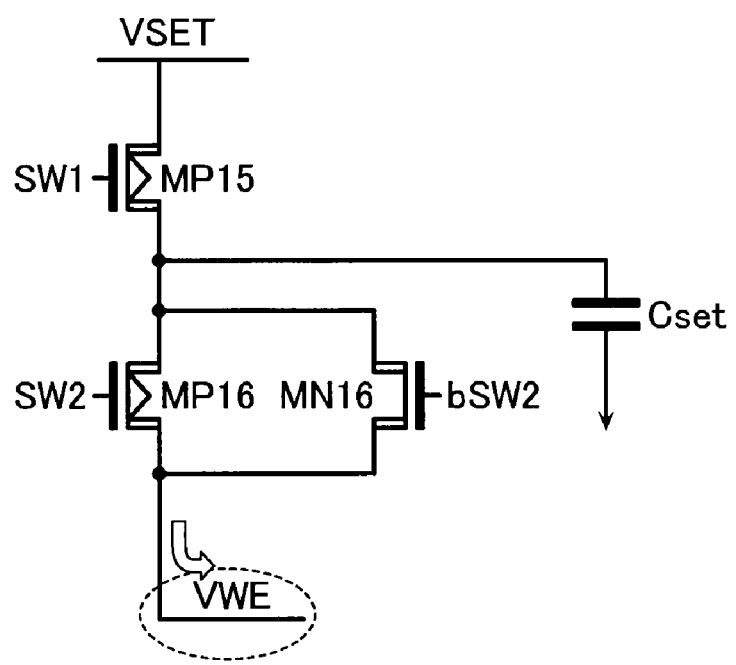
FIG. 13 is a circuit diagram of a charge sharing circuit for use on data writing in a nonvolatile semiconductor memory according to a second embodiment of the present invention.

FIG. 13 is a circuit diagram of a charge sharing circuit or a charge limit circuit according to a second embodiment of the present invention. The charge sharing circuit is configured to control supplying a selected cell with the amount of charge necessary and sufficient for setting the selected cell and limit the charge supply amount to prevent a second reset from occurring at the time of setting.

The charge sharing circuit includes high-breakdown voltage PMOS transistors MP15, MP16 connected in series, a high-breakdown voltage NMOS transistor MN16 connected in parallel with the PMOS transistor MP16, and a capacitor Cset connected to the connection point between the transistors MP15, MP16.

In the charge sharing circuit, prior to setting, a first switch signal SW1 is activated to turn on the transistor MP15, which precharges the capacitor Cset with charge required for setting. Next, the switch signal SW1 is inactivated to turn off the transistor MP15, and a second switch signal SW2 is activated to make open a transfer gate composed of the transistors MP16, MN16. Thus, the selected cell is supplied with charge within a range of the charge on the capacitor Cset and accordingly the value of current flowing in the selected cell is limited to prevent a second reset from occurring at the time of setting as shown in FIG. 11(3).

According to this charge sharing method, capacitor Cset limits the charge flowing to the memory cell, and by Cset value trimming, the charge flowing to the memory cell can be trimmed on a chip basis.

Third Embodiment

Figure 14:
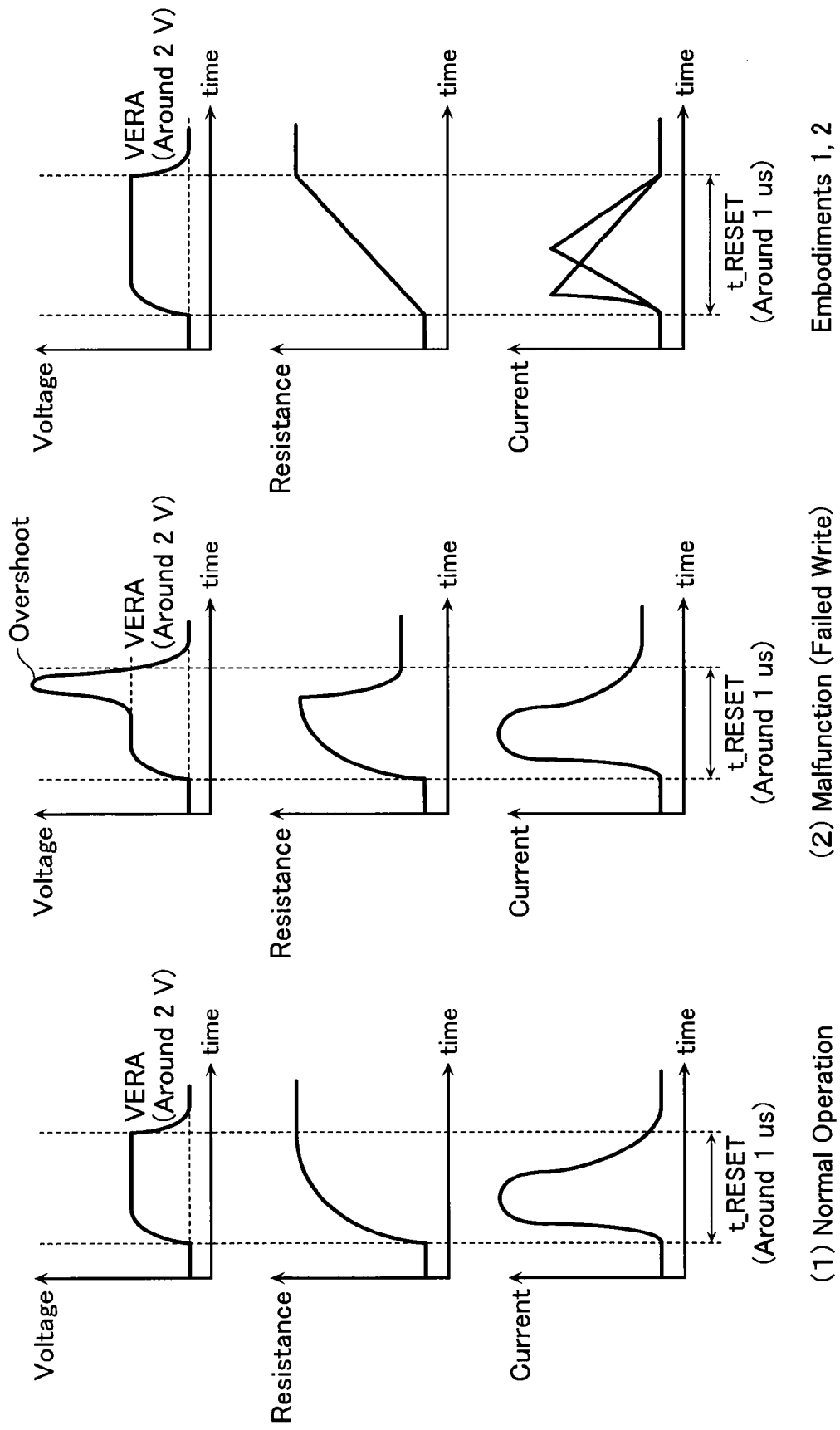
FIG. 14 provides waveform diagrams for illustrating a method of data erasing in a nonvolatile semiconductor memory according to a third embodiment of the present invention.

FIG. 14 provides operational waveform diagrams showing erase voltages VERA, resistance value variations in the memory cell MC, and current value variations in the memory cell MC on resetting by the write buffer 102. FIG. 14(1) shows operational waveforms on normal operation. When an erase voltage VERA of around 2 V is applied to a selected cell for around 1 μs, the resistance value in the selected cell varies from the low-resistance state to the high-resistance state. Initially, a large current flows because of the low resistance though the current value decreases as the resistance value in the selected cell increases.

On the other hand, FIG. 11(2) shows a case of a malfunction occurrence. When the load sharply fluctuates on resetting, the voltage regulator operative to generate the voltage pulse can not follow this speed. Thus, the supply of charge to the selected cell already turned in the high-resistance state becomes excessive, and the applied pulse becomes somewhat overshot and may be applied to the selected cell possibly. In this case, an excessive voltage above the set voltage may be applied to the selected cell to set the selected cell again.

Therefore, the third embodiment temporally controls the ability of supplying current from the pulse generator to the cell to suppress overshoot and prevent a second set.

Figure 15:
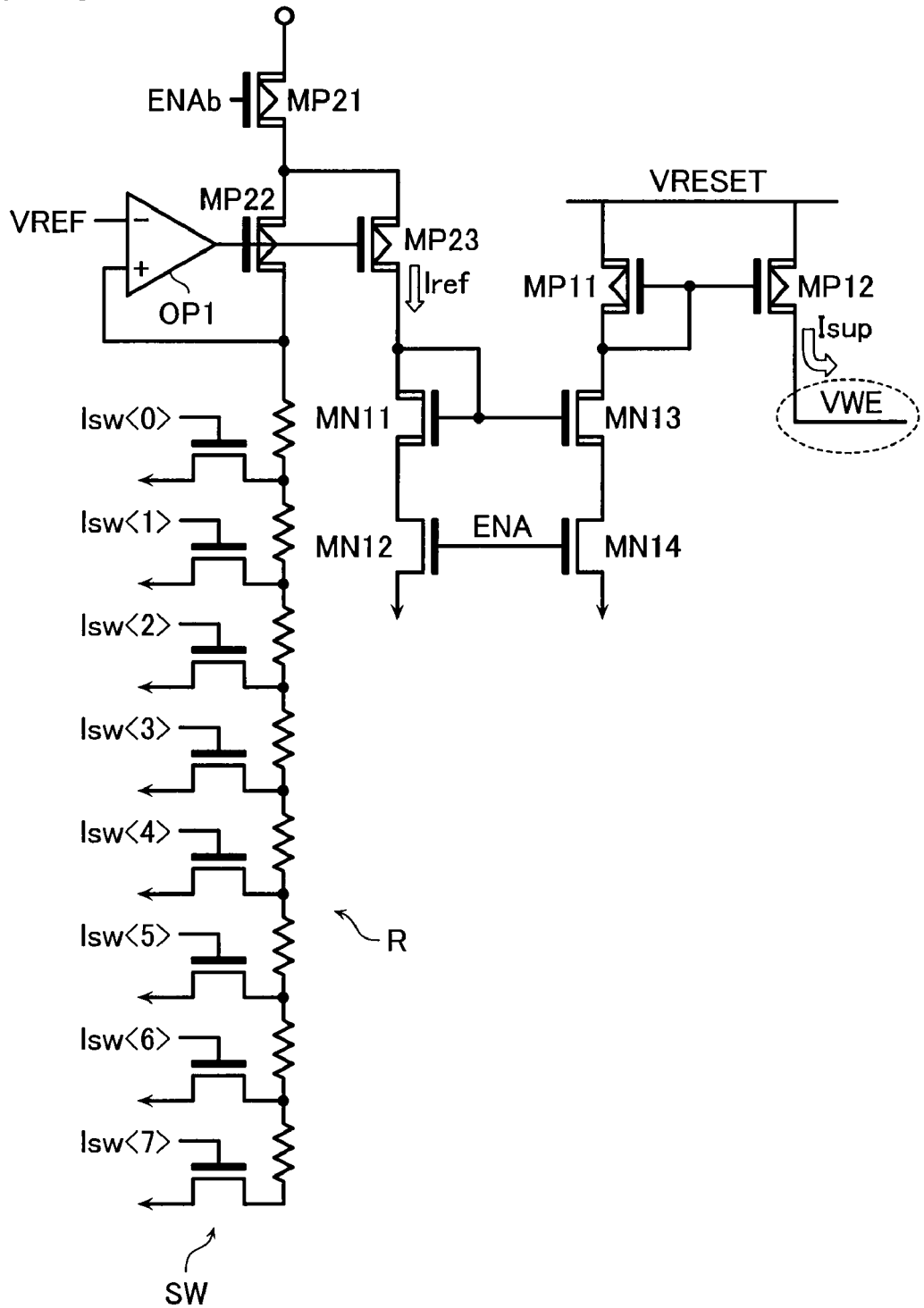
FIG. 15 is a circuit diagram of a current limit circuit for use on data erasing according to the same embodiment.

FIG. 15 is a circuit diagram showing a current limit circuit available in the present embodiment. The current limit circuit differs from the circuit of FIG. 12 in a switching circuit for temporally switching the reference current Iref, which is provided in the front stage of the current limit circuit shown in FIG. 12. The switching circuit changes the resistance value of the resistance connected to the non-inverting input terminal of an operational amplifier OP1 in response to a switching signal Isw<n> in time sequence, thereby changing the value of current flowing in a high-breakdown voltage PMOS transistors MP22 to change the reference current Iref. Switching the resistance value is achieved by a resistance value setting circuit, which comprises a resistance circuit R including plural resistors connected in series, and a switch circuit SW including NMOS transistors arranged to connect connection points between the resistors with the ground point. There is also a high-breakdown voltage PMOS transistor MP21, which is a transistor operative to activate the switching circuit with an enable signal ENAb.

Figure 16:
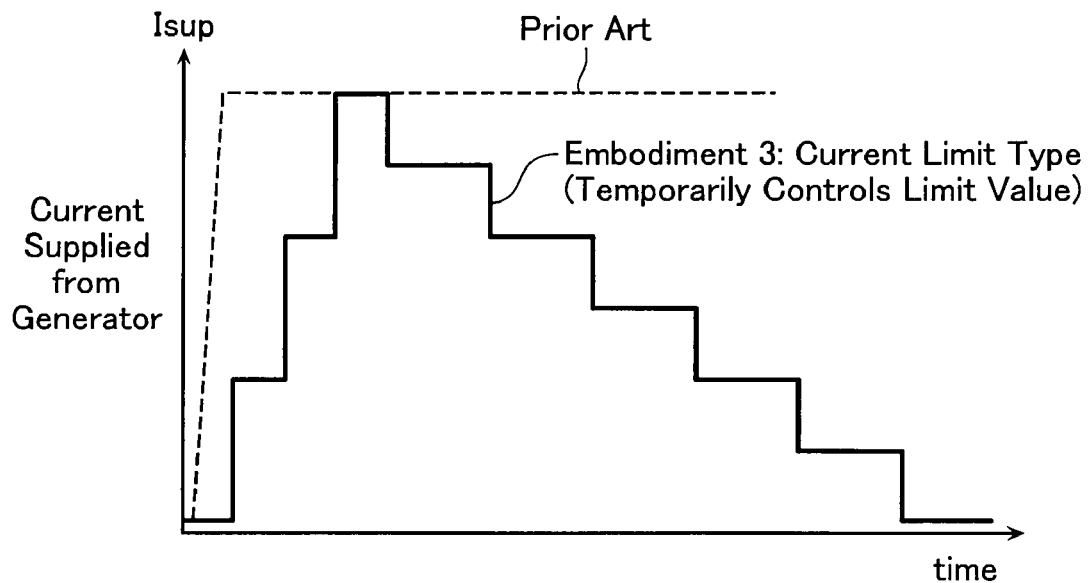
FIG. 16 is a waveform diagram showing an example of current control using the current limit circuit according to the same embodiment.

FIG. 16 shows a variation pattern of the current value in accordance with the current limit circuit. In this example, the current value is switched in eight stages with the switching signals Isw<0>-Isw<7>. For example, a control circuit such as a state machine may be used to control the switching signal Isw<n> to arbitrarily set the rising and falling gradients of the increase in current. Thus, it is possible to control the curve of the resistance value variation in the selected cell as shown in FIG. 14(3), thereby preventing a second reset from occurring due to overshoot at the time of resetting.

Fourth Embodiment

Figure 17:
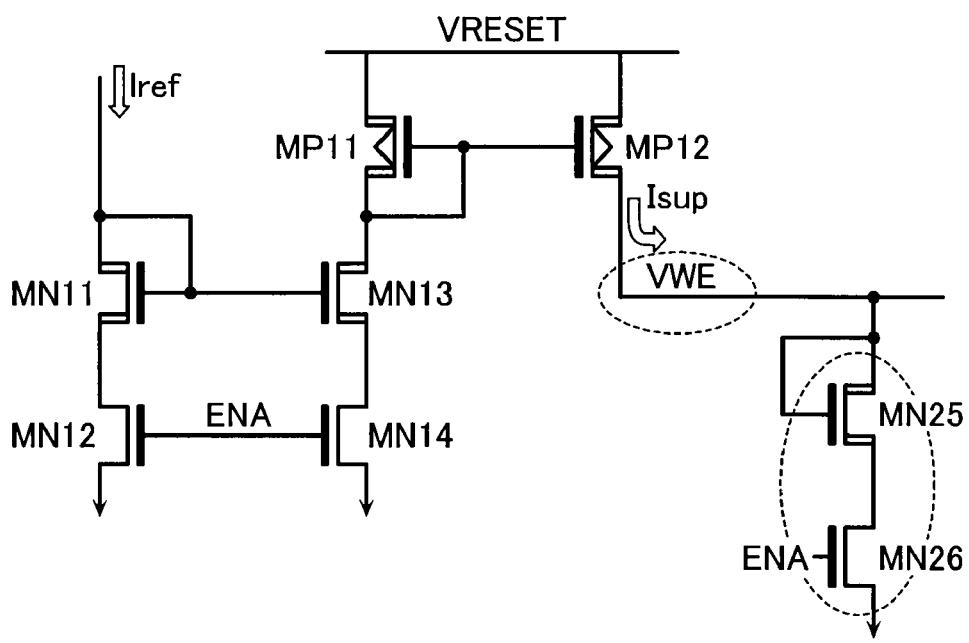
FIG. 17 is a circuit diagram of a voltage clamp circuit for use on data erasing in a nonvolatile semiconductor memory according to a fourth embodiment of the present invention.

FIG. 17 is a circuit diagram of a voltage clamp circuit available in a fourth embodiment of the present invention. The fourth embodiment limits the erase voltage VERA applied from the pulse generator to the cell to prevent a second set.

The voltage clamp circuit includes a voltage clamping, diode-connected, high-breakdown voltage NMOS transistor MN25 connected to the output terminal of the current limit circuit shown in FIG. 12. The transistor MN25 is serially connected to an NMOS transistor MN26, which activates the transistor MN25 with the enable signal ENA. The voltage clamp circuit limits the output voltage VWE from elevating above VSET, thereby preventing a second reset phenomenon from arising at the time of resetting.

Other Embodiments

The present invention is not limited to the above-described embodiments.

In the above-described embodiments the write buffer is connected to the bit line though the write buffer may be connected to the word line.

In the above-described embodiments, desirably, the limit values of current, charge and voltage are set with a fuse or the like that can be trimmed per chip previously.

What is claimed is:

1. A nonvolatile semiconductor memory device, comprising:
   a memory cell array including first and second mutually crossing lines and electrically erasable programmable memory cells arranged at intersections of said first and second lines, each memory cell containing a variable resistive element;
   a data write circuit operative to apply a voltage required for data write to said memory cell via said first and second lines; and
   a current limit circuit, on said data write, operative to limit a value of maximum suppliable currents of said data write circuit, and limit the value of current flowing in said memory cell at a certain current limit value,
   wherein said current limit circuit includes
      a first current mirror circuit having an input side that receives a flow of a certain reference current and an output side that supplies a flow of output current determined by said certain reference current and a certain mirror ratio, and
      a second current mirror circuit having an input side that receives a flow of said output current flowing through said output side of said first current mirror circuit and an output side that supplies a current limited at said certain current limit value in accordance with said output current from said first current mirror circuit and provides a voltage required for writing said data to said data write circuit.

2. The nonvolatile semiconductor memory device according to claim 1, wherein said certain current limit value can be trimmed on a chip basis.

3. The nonvolatile semiconductor memory device according to claim 1, wherein said certain current limit value is smaller than a value required for erasing said memory cell.

4. The nonvolatile semiconductor memory device according to claim 1, further comprising:
   a data erase circuit operative to supply a current required for data erase to said memory cell via said first and second lines; and
   a voltage clamp circuit operative to limit the value of a voltage applied to said memory cell on said data erase at a certain voltage limit value.

5. The nonvolatile semiconductor memory device according to claim 1, wherein said memory cell further includes a non-ohmic element serially connected to said variable resistive element.

6. A nonvolatile semiconductor memory device, comprising:
   a memory cell array including first and second mutually crossing lines and electrically erasable programmable memory cells arranged at intersections of said first and second lines, each memory cell containing a variable resistive element;

a data write circuit operative to apply a voltage required for data write to said memory cell via said first and second lines; and a charge limit circuit, on said data write, operative to limit an amount of maximum suppliable charge of said data write circuit, and limit the amount of charge supplied to said memory cell at a certain charge limit value, wherein said charge limit circuit includes a capacitor operative to accumulate a charge amount which corresponds to said certain charge limit value in accordance with a first switch signal, and discharge the accumulated charge in accordance with a second switch signal.

7. The nonvolatile semiconductor memory device according to claim 6, wherein said certain charge limit value can be trimmed on a chip basis.

8. The nonvolatile semiconductor memory device according to claim 6, wherein said certain current limit value is smaller than a value required for erasing said memory cell.

9. A nonvolatile semiconductor memory device, comprising:

a memory cell array including first and second mutually crossing lines and electrically erasable programmable memory cells arranged at intersections of said first and second lines, each memory cell containing a variable resistive element;

a data erase circuit operative to supply a current required for data erase to said memory cell via said first and second lines;

a voltage clamp circuit, on said data erase, operative to clamp a value of maximum suppliable voltage of said data erase circuit, and limit the value of a voltage applied to said memory cell on said data erase at a certain voltage limit value; and a current limit circuit operative to limit the value of current flowing in said memory cell on said data erase at a certain current limit value.

10. The nonvolatile semiconductor memory device according to claim 9, wherein said certain current limit value can be trimmed on a chip basis.

11. The nonvolatile semiconductor memory device according to claim 9, wherein said current limit circuit includes a first current mirror circuit having an input side that receives a flow of certain reference current and an output side that supplies a flow of output current determined by said reference current and a certain mirror ratio, and a second current mirror circuit having an input side that receives a flow of said output current flowing through said output side of said first current mirror circuit and an output side that supplies a current limited at said certain current limit value in accordance with said output current from said first current mirror circuit and provides a voltage required for writing said data to said data write circuit.

12. The nonvolatile semiconductor memory device according to claim 11, wherein said current limit circuit includes a switching circuit operative to change said reference current.

13. The nonvolatile semiconductor memory device according to claim 12, wherein said switching circuit in said current limit circuit includes an amplification circuit operative to receive a certain voltage and vary the output voltage in accordance with a switching signal, and a transistor contained in a current mirror pair that includes said input side of said first current mirror circuit and operative to cause a flow of current in accordance with the output from said amplification circuit.

14. The nonvolatile semiconductor memory device according to claim 13, wherein said amplification circuit in said current limit circuit includes an operational amplifier having an inverting input terminal to receive a reference voltage thereon and an output terminal connected to the gate of said transistor, and a resistance value setting circuit connected between the non-inverting input terminal of said operational amplifier and the drain of said transistor, and containing a resistance circuit of plural serially connected resistors, and a switch circuit having transistors arranged to connect connection points between said resistors in said resistance circuit with the ground point.

15. The nonvolatile semiconductor memory device according to claim 14, wherein the resistance value of said resistance value setting circuit in said amplification circuit is switched in time sequence in stages.

16. The nonvolatile semiconductor memory device according to claim 9, wherein said voltage clamp circuit includes a diode-connected transistor, arranged on the output terminal of said data erase circuit.

17. The nonvolatile semiconductor memory device according to claim 9, wherein said memory cell further includes a non-ohmic element serially connected to said variable resistive element.

18. The nonvolatile semiconductor memory device according to claim 1, wherein said data current limit circuit, on said data write, switches said certain current limit value gradually and serially.

* * * * *